US011269629B2

(12) United States Patent
Zhang et al.

(10) Patent No.: US 11,269,629 B2
(45) Date of Patent: Mar. 8, 2022

(54) SRAM-BASED PROCESS IN MEMORY SYSTEM

(71) Applicant: The Regents of The University of Michigan, Ann Arbor, MI (US)

(72) Inventors: Zhengya Zhang, Ann Arbor, MI (US); Thomas Chen, Ann Arbor, MI (US); Jacob Christopher Botimer, Ann Arbor, MI (US); Shiming Song, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 45 days.

(21) Appl. No.: 16/204,153

(22) Filed: Nov. 29, 2018

(65) Prior Publication Data

US 2020/0174786 A1 Jun. 4, 2020

(51) Int. Cl.
| | |
|---|---|
| *G06F 9/30* | (2018.01) |
| *G11C 11/412* | (2006.01) |
| *G06F 17/13* | (2006.01) |
| *G06F 7/544* | (2006.01) |
| *G11C 11/417* | (2006.01) |

(52) U.S. Cl.
CPC .......... *G06F 9/3001* (2013.01); *G06F 7/5443* (2013.01); *G06F 17/13* (2013.01); *G11C 11/412* (2013.01); *G11C 11/417* (2013.01)

(58) Field of Classification Search
CPC ....... G06F 9/3001; G06F 7/5443; G06F 17/13
See application file for complete search history.

(56) References Cited

U.S. PATENT DOCUMENTS

| 5,473,554 | A | 12/1995 | Covey | |
|---|---|---|---|---|
| 5,809,322 | A * | 9/1998 | Akerib | G06F 15/8023 710/33 |
| 7,289,354 | B2 * | 10/2007 | Houston | G11C 8/08 365/154 |
| 7,965,564 | B2 | 6/2011 | Lavi et al. | |
| 2004/0196717 | A1 * | 10/2004 | Richards | G11C 7/14 365/210.1 |
| 2019/0043560 | A1 * | 2/2019 | Sumbul | G11C 13/004 |

FOREIGN PATENT DOCUMENTS

EP 0448367 9/1991

* cited by examiner

*Primary Examiner* — Michael D. Yaary

(57) ABSTRACT

Many signal processing, machine learning and scientific computing applications require a large number of multiply-accumulate (MAC) operations. This type of operation is demanding in both computation and memory. Process in memory has been proposed as a new technique that computes directly on a large array of data in place, to eliminate expensive data movement overhead. To enable parallel multi-bit MAC operations, both width- and level-modulating memory word lines are applied. To improve performance and provide tolerance against process-voltage-temperature variations, a delay-locked loop is used to generate fine unit pulses for driving memory word lines and a dual-ramp Single-slope ADC is used to convert bit line outputs. The concept is prototyped in a 180 nm CMOS test chip made of four 320×64 compute-SRAMs, each supporting 128× parallel 5 b×5 b MACs with 32 5 b output ADCs and consuming 16.6 mW at 200 MHz.

16 Claims, 8 Drawing Sheets

SRAM-BASED PROCESS IN MEMORY SYSTEM

GOVERNMENT CLAUSE

This invention was made with government support under HR0011-17-2-0018 awarded by the U.S. Department of Defense, Defense Advanced Research Projects Agency. The government has certain rights in the invention.

FIELD

The present disclosure relates to in memory computer applications and a SRAM-based process in memory system design.

BACKGROUND

Many scientific computing applications require high-precision arithmetic operations, in particular, multiply-accumulate operations. A good example is the solution to partial differential equations (PDEs). Many physical phenomena, such as heat and fluid dynamics, are described by PDEs. Most PDEs are solved numerically, by first quantizing the solution space in a grid and then iteratively refining the solution using the Jacobi method.

High-precision PDE solutions require fine grids and high numerical precision, leading to a significant amount of data that need to be processed, moved and stored. Moreover, a PDE solver commonly requires thousands of iterations to converge. Hardware PDE solvers have been proposed, but scaling up the accelerators to support practical problems is a challenge, due to the difficulties of providing a high compute density and a high memory bandwidth.

Recently, process in memory (PIM), also known as compute in memory, has been proposed as a new technique that computes directly on a large array of data in place, within memory, to eliminate the expensive data movement overhead. By overcoming the memory wall, PIM holds the potential of achieving both high performance and efficiency in tasks that involve parallel multiply-accumulate (MAC) operations, such as classification and neural networks.

SRAM-based PIM designs rely on level- and/or width-modulating wordlines of the SRAM array to encode multipliers, and activating multiple wordlines in parallel. The SRAM cells' currents in discharging the bitlines represent the products, and the total current on each bitline represents the sum of products. Alternatively, bitlines can be modulated to encode multipliers, and bitlines are joined to produce the sum of products.

Current SRAM-based PIM designs are limited by SRAM's binary storage and the overhead of multi-bit analog-to-digital conversion. Some designs support only binary multiplicands stored in SRAM; and some choose a limited output precision and bandwidth. To remove the need of multibit ADCs, some designs quantize outputs to 1 b. To reduce the number of ADCs, some designs are tailored to computations in a cone structure that require only one or a small number of ADCs at the final output. These approaches have been successfully demonstrated, but they are not applicable to a PDE solver that requires iterative multi-bit operations and solutions to be updated in every iteration.

Therefore, it is desirable to achieve SRAM-based process in memory system that supports multiply-accumulate operations on multibit multiplicands and multipliers, and provides a sufficient number of low-cost analog-to-digital converters to digitize all its outputs.

This section provides background information related to the present disclosure which is not necessarily prior art.

SUMMARY

This section provides a general summary of the disclosure, and is not a comprehensive disclosure of its full scope or all of its features.

A system is provided for performing multiply-accumulate operations on binary numbers. The system is comprised of an array of memory cells arranged in columns and rows, such that memory cells in each row of the array is interconnected by a respective wordline and each column of the array is interconnected by a respective bitline. A multiplicand is a binary number comprised of multiple bits and is stored across a group of memory cells in the array, such that the value of each bit in the binary number is stored in a different memory cell within the group of memory cells. Each memory cell in a given group of memory cells is configured to receive an input signal indicative of a multiplier and outputs a product of the multiplier and the value of the bit stored in the given memory cell onto the corresponding bitline of a given memory cell, where the value of the multiplier is encoded in the input signal using width modulation. A driver circuit is electrically connected to each wordline in a given group of memory cells and operates to drive the wordlines with a set of voltages, where magnitude of the voltage produces a cell discharging current that is proportional to significance of bit stored in the corresponding memory cell.

The system further includes a set of input switches interposed between the driver circuit and the given group of memory cells. Each input switch in the set of input switches is configured to receive the input signal and turn on the input switch for a period of time corresponding to the value of the multiplier encoded on the input signal, thereby driving the wordlines for the given group with a set of voltages provided by the driver circuit.

In one embodiment, each memory cell is further defined as static random-access memory. More specifically, each memory cell in the array of memory cells includes a pair of access transistors in a stacked arrangement and a storage circuit configured to store a bit value, such that the magnitude of current drawn through the pair of access transistors is determined by magnitude of voltage on the respective wordline and value of the bit stored in the storage circuit. A gate terminal of one access transistor in the pair of access transistors is electrically coupled to the respective wordline and a gate terminal of the other access transistor in the pair of access transistors is electrically coupled to the storage circuit.

In some embodiments, the system is configured to solve partial differential equations using a residual form.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Without loss of generality, the solution of Poisson's equation is used to explain a PDE solver design. Poisson's equation is widely used in practical applications. The 2D Poisson's equation is described in (1).

$$\nabla^2 u = \frac{\partial^2 u}{\partial x^2} + \frac{\partial^2 u}{\partial y^2} = b, \tag{1}$$

where b(x,y) is given and u(x,y) is sought. To solve Poisson's equation, the PDE can be first discretized to a grid of step size $\Delta x$ and $\Delta y$ along x and y using the finite difference method, resulting in a system of equations of the form shown in (2)

$$\frac{u_{i-1,j} + u_{i+1,j} - 2u_{i,j}}{\Delta x^2} + \frac{u_{i,j-1} + u_{i,j+1} - 2u_{i,j}}{\Delta y^2} = b_{i,j}, \tag{2}$$

where $u_{i-1,j}$ represents the value of u at grid position (i−1, j), $u_{i+1,j}$ is the value of u at (i+1,j), and so on.

Equations of the form (2) can be written in the matrix form Au=b (note that A is a sparse matrix), and it can be solved using the Jacobi iterations as in equation (3).

$$u^{(n+1)} = Ru^{(n)} - b, \tag{3}$$

where R=A−I and it is called the stencil matrix, and b is a constant over the iterations. Note that R is also a sparse matrix.

Figure 1A:
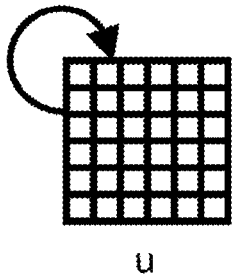
FIGS. 1A-1C are diagrams depicting PDE mapping approaches: fine-grid only, multi-grid with residual on coarse grid, and multi-grid with residuals on both grids.
Figure 1B:
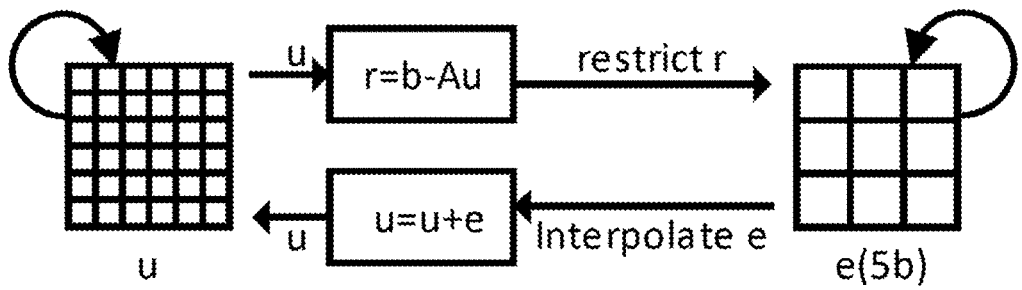

To reach an accurate solution, a fine grid of fine step sizes is needed in implementing the Jacobi method, as shown in FIG. 1A. However, a fine grid results in a large volume of data and a relatively slow convergence. To speed up convergence, the multi-grid method introduces a coarse grid in addition to the fine grid as shown in FIG. 1B. By interleaving coarse-grid iterations with fine-grid iterations, low-frequency errors are reduced to accelerate convergence.

As described in equation (4) and graphically illustrated in FIG. 1B, to transition from fine grid to coarse grid, restriction is applied to project the residual, r, to coarse grid. To transition from coarse grid back to fine grid, interpolation is applied to project e to fine grid, which is used to update u.

$$r = b - Au^{(n)}$$

$$Ae = \text{restrict}(r) \tag{4}$$

$$u^{(n+1)} = u^{(n)} + \text{interpolate}(e).$$

Figure 1C:
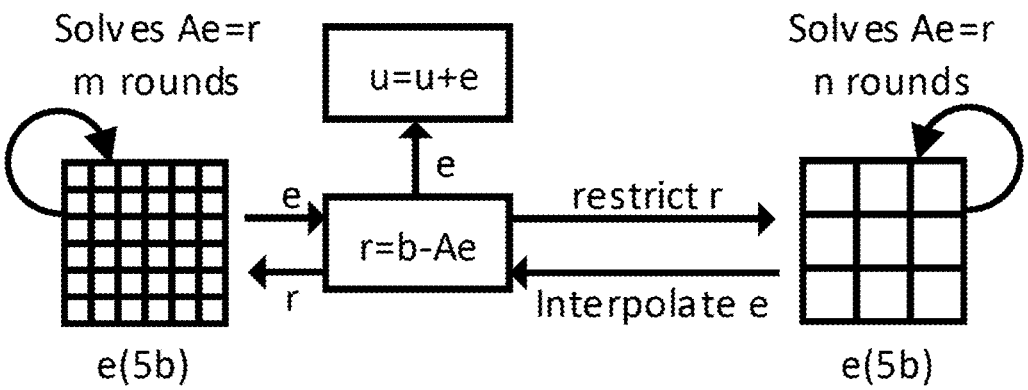

The coarse-grid compute solves for the error term e using Jacobi iterations as in equation (5).

$$e^{(n+1)} = Re^{(n)} - s, \tag{5}$$

where R is the stencil matrix and s is the restricted r. Because coarse-grid compute operates on errors, the required numerical precision is reduced. By proper numerical windowing and using more iterations, the precision can be reduced to 5 b or lower for coarse-grid compute. In this disclosure, the residual approach is furthered extended to fine-grid compute to reduce its precision to 5 b or lower, as shown in FIG. 1C. Both fine-grid and coarse-grid compute perform Jacobi iterations.

This low-precision residual approach makes it possible to map the core computation, $Re^{(n)}$ in equation (5), to compute-SRAMs. The stencil matrix R is sparse, making it highly inefficient to be stored in SRAM. Instead, one can store the errors e in SRAM with each 5 b value stored in 5 cells in consecutive rows and 5 b stencil weights are applied as wordline pulses to the SRAM. The MAC outputs are quantized to 5 b.

In a typical PIM design, all rows of the memory are activated at the same time to unleash the full parallelism. However, in a PDE solver, R is sparse, so activating all rows is wasteful. Therefore, one can apply only a set of non-zero stencil entries at a time. For example, in solving the 2D Poisson's equation in equation (2), four stencil entries are applied at the same time. Activating a subset of rows of the memory also reduces the precision of the bitline outputs, requiring only 5 b outputs to meet the high accuracy needed by a PDE solver.

Figure 2:
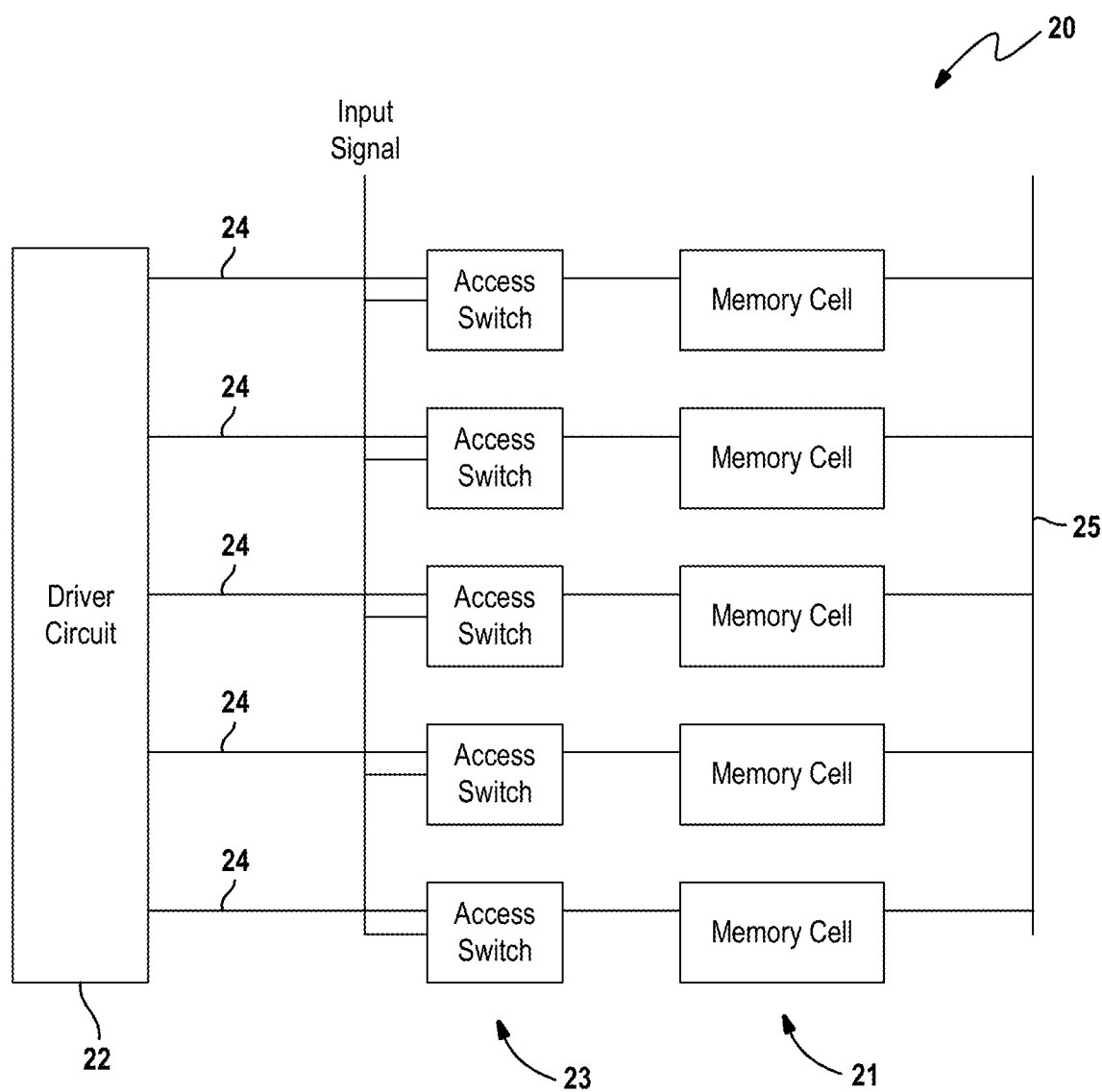
FIG. 2 is a diagram depicting a system for performing multiply-accumulate operations involving multibit multiplicands and multipliers.

FIG. 2 depicts a portion of a system 20 for performing multiply-accumulate operations on multi-bit binary numbers in accordance with this disclosure. The system 20 is comprised generally of: an array of memory cells 21 arranged in columns and rows, a driver circuit 22 for driving the wordlines interconnecting the memory cells; and a set of input switches 23 interposed between the driver circuit and the memory cells. The memory cells in each row of the array are interconnected by a respective wordline 24; whereas, the memory cells in each column of the array are interconnected by a respective bitline 25. In the example embodiment, each memory cell is further defined as a static random-access memory (SRAM) although other types of memory cells are contemplated by this disclosure.

For a binary number comprised of multiple bits, the memory cells are grouped into groups of memory cells, such that the value of each bit in the binary number is stored in a different memory cell within the group of memory cells. For example, a value for each bit in a 5 bit binary number is stored in a group of 5 adjacent rows of the array, where the value for the most significant bit is stored in memory cell on the top row of a group and the value for the least significant bit is stored in memory cell in the bottom row of a group as seen in FIG. 2. In this way, a multiplicand of the multiply-accumulate operation is a binary number comprised of multiple bits and stored across a one group of memory cells in the array. It is readily understood that the number of rows in a given group of memory cells may be more or less depending on the number of bits in the binary number.

The driver circuit 22 is electrically connected to each wordline 24 in a given group of memory cells and operates to drive the wordlines with a voltage. That is, for each group of memory cells there is one driver circuit. More specifically, the magnitude of the voltage used to drive a given wordline corresponds to significance of the bit stored in the corresponding memory cell. In an example embodiment, the driver circuit 22 can be implemented as a current mirror having a stage for each wordline in the group of memory cells. The current mirror generates the voltages to drive the wordlines of the bottom cell to the top cell to provide 1×, 2×, 4×, 8×, and 16× bitline discharge current, corresponding to significance of each bit. Other types of driver circuits are also envisioned by this disclosure.

A set of input switches 23 are interposed between the driver circuit 22 and a given group of memory cells as seen in FIG. 2. Each input switch in the set of input switches 23 is configured to receive an input signal. In the example embodiment, the input signal represents the multiplier and the value of the multiplier is encoded in the input signal using width modulation. Assuming a 4 bit binary multiplier, each pulse in the input signal has a width selected from zero (0) to fifteen (15) unit width. The input switches are turned on for a period of time corresponding to the pulse width (i.e., the value of the multiplier encoded on the input signal) and thereby drives the corresponding wordline with a voltage provided by the driver circuit. Depending upon the application, it is understood that the multiplier may be comprised of more or less bits.

In operation, each memory cell in a given group of memory cells is configured to receive an input signal indicative of a multiplier. The memory cell in turn outputs a product of the multiplier and the value of the bit stored in the given memory cell onto a corresponding bitline coupled to a given memory cell. In this way, the magnitude of the current on the bitline corresponds to the product of multiplier and the value of the binary number stored in the given group of memory cells. It is noted that the significance of the bit is applied by the magnitude of the voltage used to drive the given wordline.

In one example embodiment, a prototype PDE solver chip is designed in 180 nm CMOS based on four (4) compute-SRAMs. Each compute-SRAM is a 320×64 8 T SRAM array that is completed with peripherals. The four compute-SRAMs can be used to compute four independent grids of up to 64×64 (5 b grid values), or they can be joined to support a grid of up to 127×127 (5 b grid values). In this embodiment, the precision is configurable from 1 b to 5 b although more bits can also be used. A buffer is added to each compute-SRAM to forward grid values between iterations. Offset subtraction is performed at the output of each compute-SRAM, and a separate memory is used to store the offsets s. The chip may include more or less compute-SRAMs. Likewise, the size of each SRAM array can vary.

Figure 3:
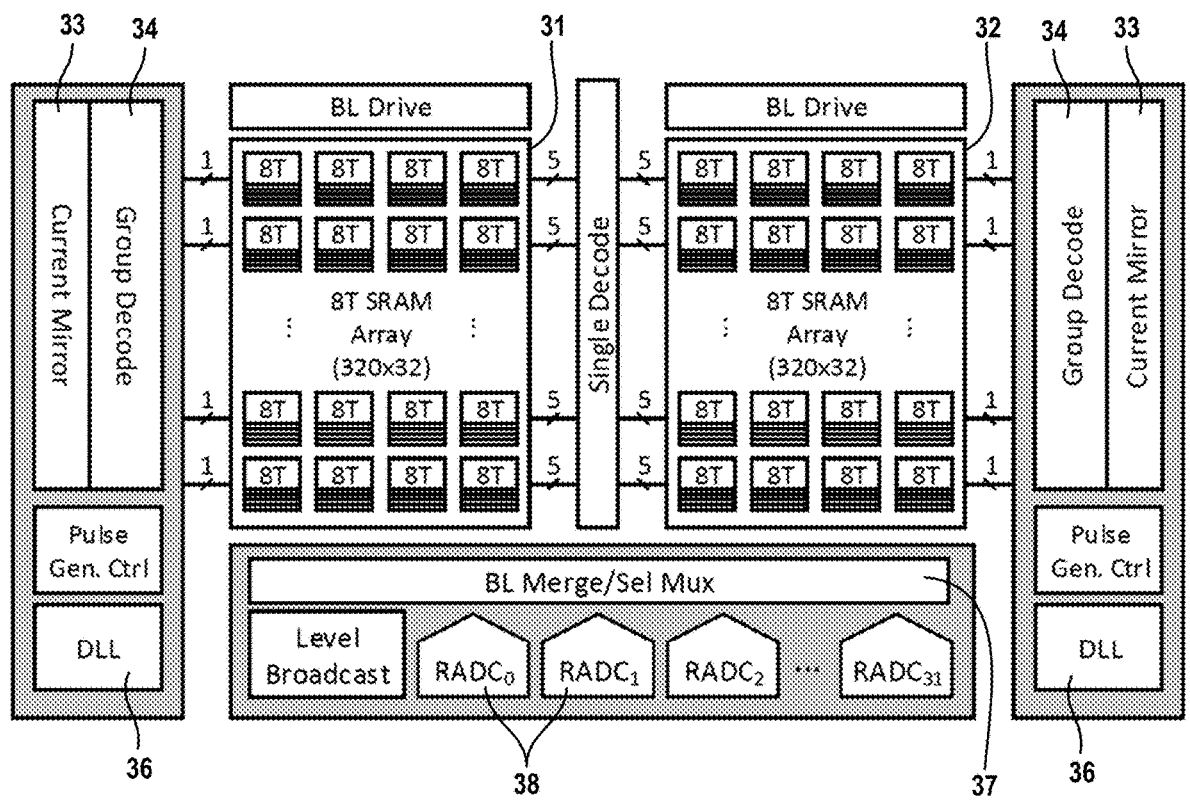
FIG. 3 is a block diagram of an example system architecture of two 320×32 SRAM arrays in a folded structure.

With reference to FIG. 3, the 320×64 compute-SRAM is made of two 320×32 SRAM arrays 31, 32 in a folded structure. The compute-SRAM occupies 0.467 mm$^2$ in 180 nm CMOS and is clocked at 200 MHz. It supports two modes: a single read/write mode for normal memory access, and a group read mode for MAC operations. In the group read mode, up to 20 rows (i.e., four 5 b groups) are selected in parallel by the group decoder 34. 5 b width-modulation of WL is controlled by a delay-locked loop circuit (DLL) 36, and 5 b level-modulation is implemented by current mirrors 33. Merge and select muxes 37 allow analog summation of partial products. The 32 merged bitlines (BLs) are digitized by 32 5 b analog-to-digital converters (ADCs) 38.

Figure 4:
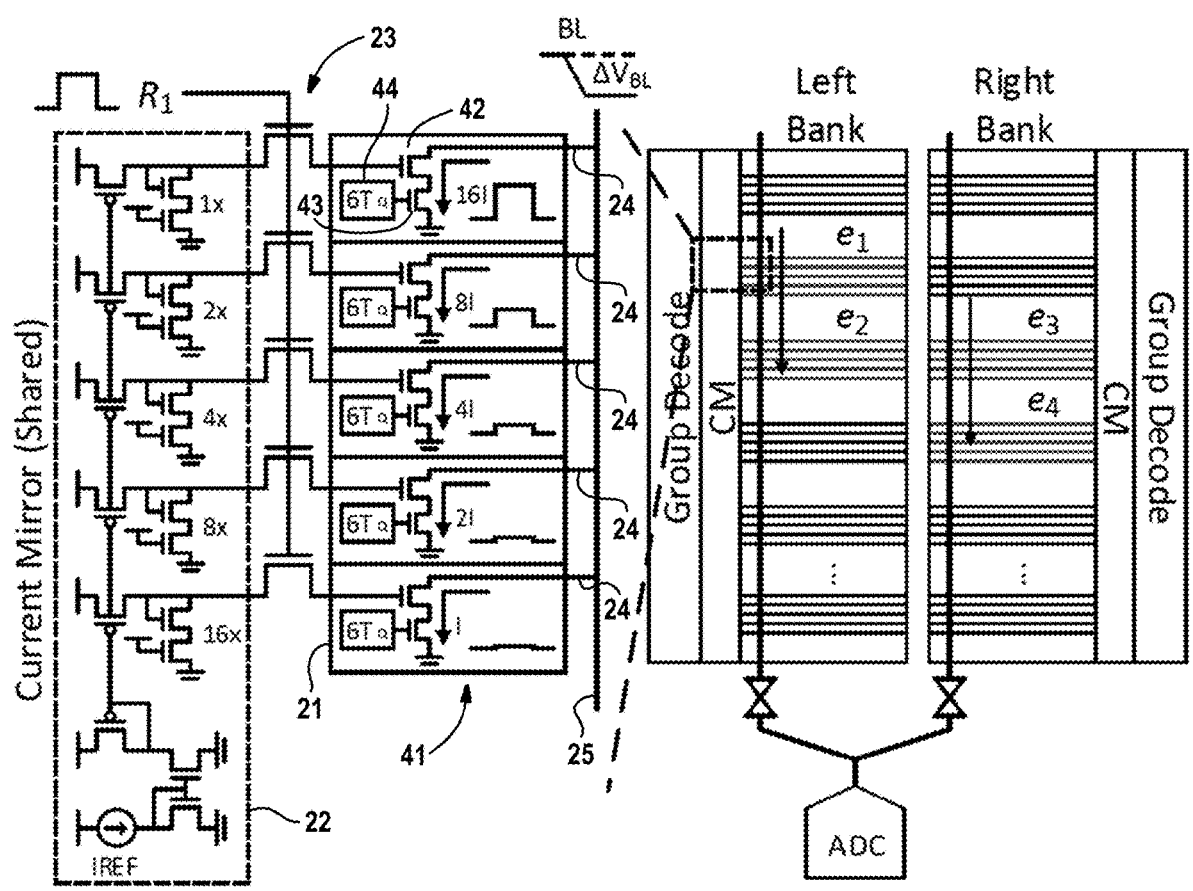
FIG. 4 is diagram illustrating a group read for MAC operations.

FIG. 4 further illustrates the group read mode, showing four stencil entries ($R_1$, $R_2$, $R_3$, $R_4$) applied from both sides of the SRAM to four error vectors ($e_1$, $e_2$, $e_3$, $e_4$) stored in 20 rows of the SRAM array for MAC operations. A 5 b error value is stored across 5 SRAM cells comprising a group of SRAM cells 41. The MAC operations are conducted in groups in the following manner: 1) the group decoder turns on the access to a group of 5 SRAM rows; 2) the wordline pulse width (PW) is selected by a 5 b stencil entry; 3) current mirrors provide the voltage to the 5 wordlines of a group to enable 1×, 2×, 4×, 8×, and 16× discharge currents for the analog readout of 5 b error values; and 4) the products between the stencil entry and the error values are accumulated on the bitlines. In this example, up to 4 groups of cells are activated at the same time to enable 128 5b×5 b MACs in parallel in the compute-SRAM. It is understood that more or less groups may be activated.

Further details are also provided for the driver circuit 22 and the memory cell 21. In this example embodiment, the driver circuit 22 is implemented by a current mirror. Each stage mirrors the reference current. Through 1×, 2×, 4×, 8× and 16× sizing of the bit cell replicas, each stage of the driver generates the appropriate voltage to drive the corresponding wordlines, so that the cell from the bottom to the top of the group provides 1×, 2×, 4×, 8× and 16× the discharging current. When the input switch 23 is biased on by the input signal, the voltage is applied to the memory cell 21, where the magnitude of the voltage corresponds to significance of bit stored in the memory cell 21.

Memory cells 21 may be comprised of a pair of read access transistors 42, 43 in a stacked arrangement electrically coupled to a storage circuit 44, where the storage circuit 44 is configured to store a bit value. In this example embodiment, the storage circuit 44 is further defined as a static-random-access memory, for example with a conventional 6 T arrangement. The gate terminal of one of the access transistors 42 in the pair of access transistors is electrically coupled to the wordline while the gate terminal of the other access transistor 43 is electrically coupled to the storage circuit.

During operation, the magnitude of current drawn through the pair of access transistors 42, 43 is determined by the magnitude of the voltage on the respective wordline and the value of the bit stored in the storage circuit 44. When the value of the stored bit is zero, the lower access transistor is turned off and no current is drawn through the pair of access transistors. Conversely, when the value of the stored bit is one, the lower access transistor is turned on and current is drawn through the pair of access transistors. Furthermore, the magnitude of the current is controlled by the magnitude of the voltage applied to the gate terminal of the upper access transistor. In this way, the magnitude of the voltage produces a cell discharging current on the bitline that is proportional to significance of bit stored in the corresponding memory cell. The magnitude of the current on the bitline represents the product of the multiplier and the value of the bit stored in the memory cell. In this example, bitline voltage is dropping so that the magnitude of the current on the bitline is inverted to yield the product. It is envisioned that the inversion can be embedded into the ADc or after digitization.

Figure 5:
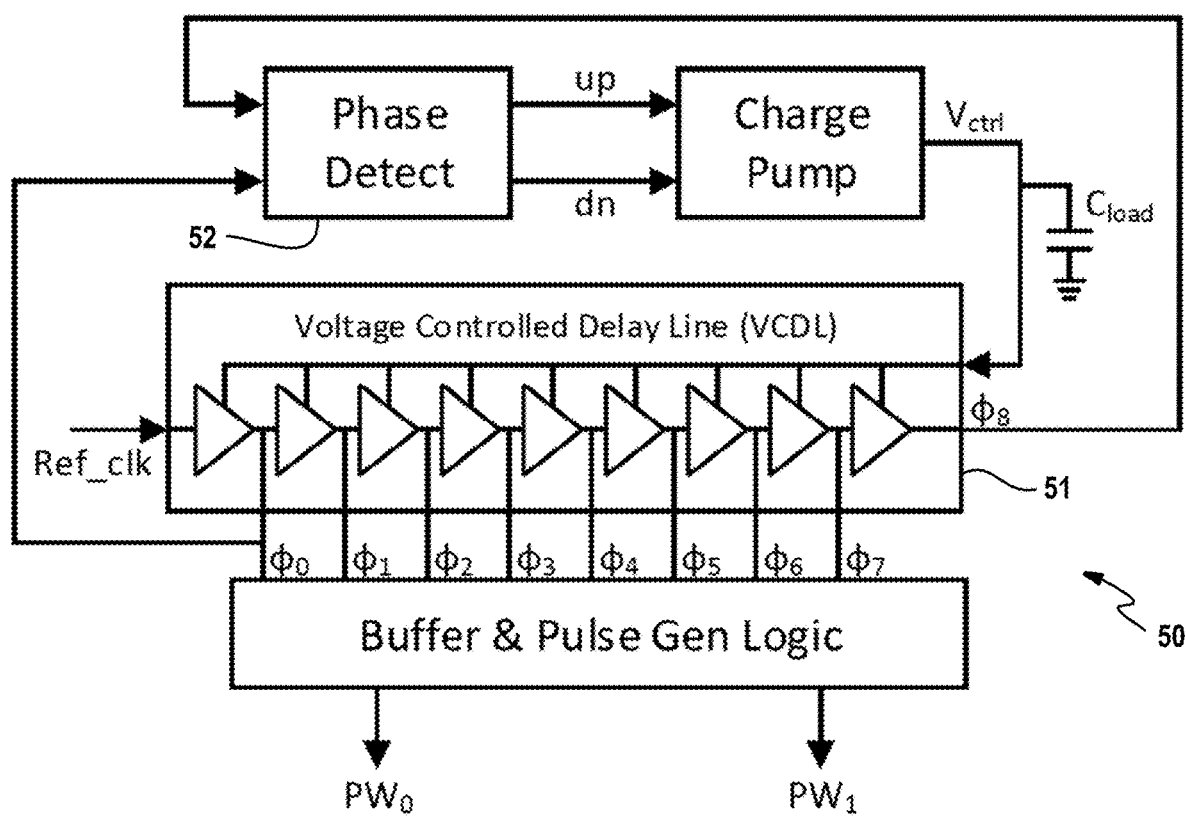
FIG. 5 is a diagram of an example delay-locked loop (DLL) design for wordline pulse generation.

In one embodiment, one can use one clock period, e.g., 5 ns, as the unit pulse width, such that a 5 b wordline pulse will take 32 clock cycles, or 160 ns. To improve performance while meeting a reasonable pulse resolution, one can also use a fraction of a clock period, e.g., 625 ps or ⅛th of a 5 ns clock period, as the unit pulse width, so a 5 b wordline pulse only takes 20 ns. To ensure a well-controlled pulse width, one can design a delay-locked loop (DLL) circuit to generate pulses having durations that are a fraction of the clock cycle of a reference clock. With reference to FIG. 5, the DLL 50 uses an 8-stage voltage-controlled delay line 51 in a control loop to generate 8 phases of a 5 ns clock period. The phases are continuously adjusted by tracking the 200 MHz reference clock using a phase detector 52, and errors are corrected by the control voltage of the delay line. The DLL occupies 1,500 μm$^2$ in a 180 nm prototype design and it consumes 950 μW. It provides the unit PW with a maximum tracking error of 12 ps under process-voltage-temperature (PVT) variations, which is more robust than an open-loop approach. This implementation is merely exemplary and other designs for a DLL are envisioned by this disclosure.

In one embodiment, each bitline in the array of memory cells is electrically coupled to an analog-to-digital converter (ADC) for digitizing the analog summation on the bitline. In some embodiments, an ADC may be electrically coupled to more than one bitline and thereby digitize the sum of the current across the bitlines. In any case, the ADC is preferably compact and energy-efficient to avoid becoming a bottleneck of the design. Therefore, flash or SAR architectures are excluded. Instead, one can choose a ramp ADC that consists of a ramp reference and a counter shared by all columns, and a single comparator and latch per column. The ramp architecture minimizes the area and energy, but a 5 b conversion requires 32 time steps.

Figure 6:
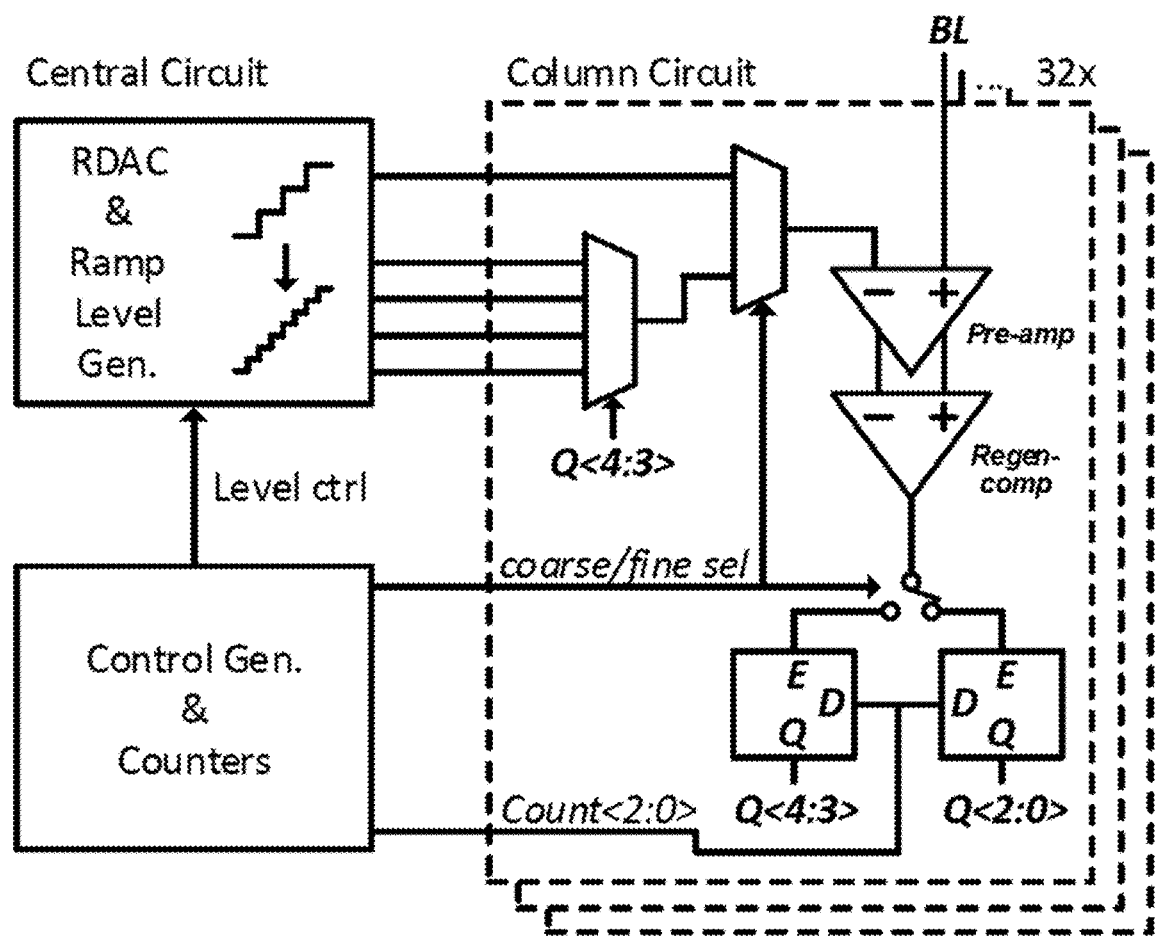
FIG. 6 is a diagram of a 5-bit dual-ramp single-slope ADC design for bitline readout.

To increase conversion speed, one can adopt a dual-ramp single-slope (DRSS) architecture to apply a 2 b coarse-ramp comparison followed by a 3 b fine-ramp comparison, as seen in FIG. 6. The bitline voltage is first compared with the 2 b coarse ramp to obtain the 2 b MSB, which then selects one of four 3 b fine ramps for comparison to obtain the 3 b LSB. The dual-ramp approach reduces the conversion time to $2^2+2^3=12$ time steps, faster than a serial conversion architecture.

In implementing DRSS ADCs, a central circuit is shared by 32 columns and it generates two ramps by a resistive DAC. A compact column circuit consists of a pre-amplifier followed by a regenerative comparator and latches. In a prototype design, the 32 ADCs in a compute-SRAM occupy 0.044 m$^2$ and the conversion costs 8.91 mW at 200 MHz. Under PVT variations, the differential nonlinearity (DNL) of the ADCs is kept below 0.5 b to ensure accurate 5 b conversion even without any calibration.

Figure 7:
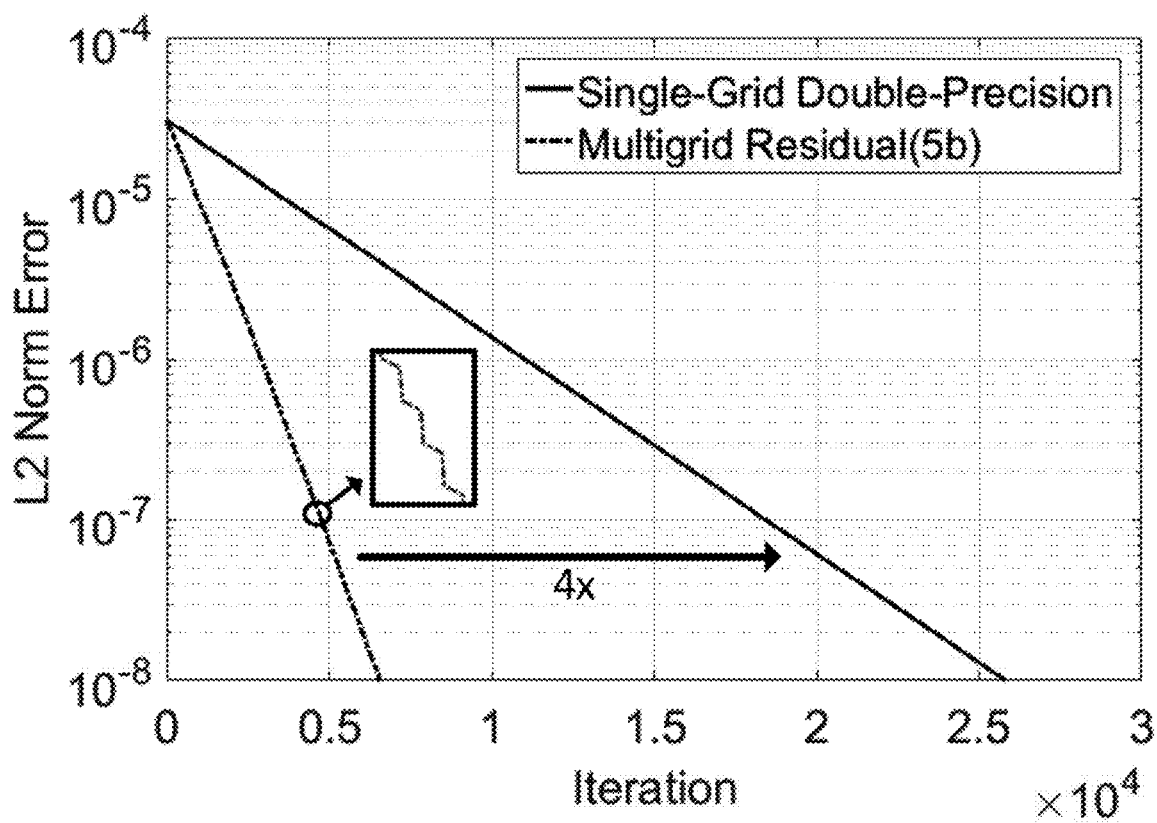
FIG. 7 is a graph showing convergence of 5 b multi-grid compared to single-grid baseline implementation.

As a proof of concept, a 180 nm 11.0 mm$^2$ PDE solver test chip was fabricated and tested. The chip consists of a PDE solver and BIST circuits. The 4 compute-SRAMs in the PDE solver core each takes 570 μm×820 μm and dissipates 16.6 mW when performing group read at 200 MHz and room temperature. When running Jacobi iterations, the 5 b multi-grid compute-SRAM PDE solver reaches an error tolerance of $10^{-8}$ while speeding up convergence by 4× over the baseline double-precision single-grid implementation, as shown in FIG. 7.

Figure 8:
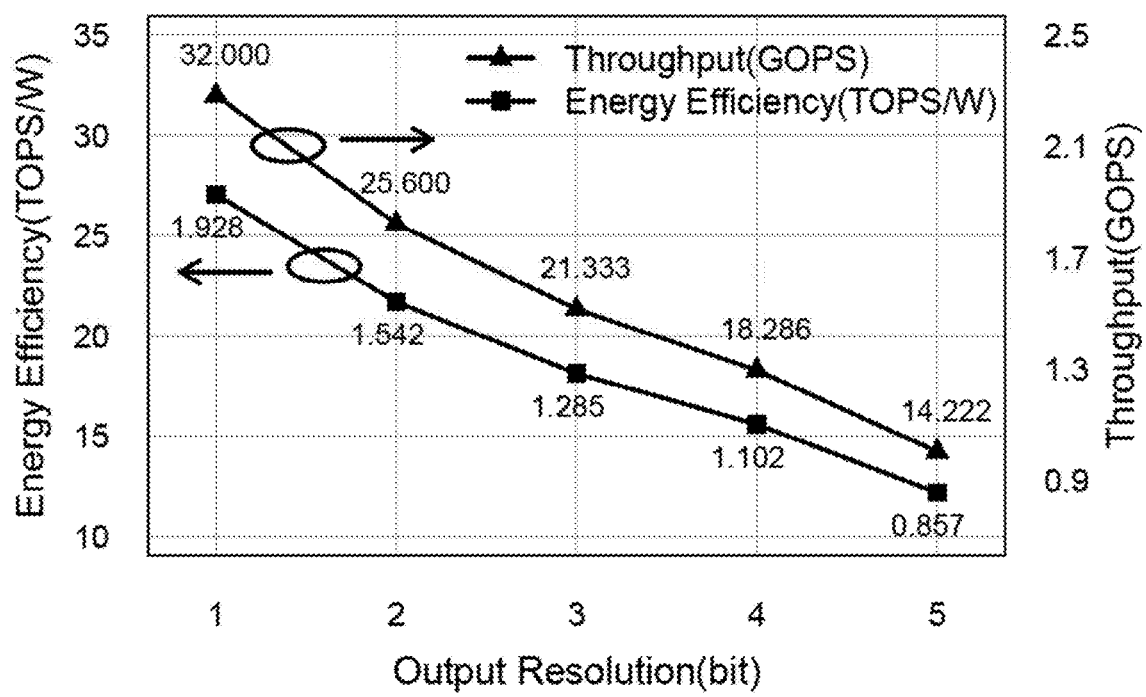
FIG. 8 is a graph showing performance and energy efficiency for the proposed system.

The 200 MHz compute-SRAM completes 128 5 b×5 b MAC operations in 18 clock cycles, including 4-cycle wordline pulse, 1-cycle bitline propagation, 12-cycle ADC and 1-cycle latching. With 4 compute-SRAMs, the PDE solver chip performs 512 5 b×5 b MAC operations every 18 clock cycles. Following the approach described by A. Biswas et al "Cony-RAM: An energy-efficient SRAM with embedded convolution computation for low-power CNN-based machine learning applications" in ISSCC, 2018, pp. 488-490 which counts an operation at each active SRAM cell as 2 Ops, the performance and energy of each compute-SRAM are 14.2 GOPS and 857 GOPS/W, respectively. At a lower precision, the performance and energy efficiency can be more than doubled, as shown in FIG. 8.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A system for performing multiply-accumulate operations on binary numbers, comprising:
   an array of memory cells arranged in columns and rows, such that memory cells in each row of the array is interconnected by a respective wordline and each column of the array is interconnected by a respective bitline, where a multiplicand is a binary number comprised of multiple bits and stored across a group of memory cells in the array, such that the value of each bit in the binary number is stored in a different memory cell within the group of memory cells;
   a driver circuit configured to generate a set of voltages proportional to significance of the corresponding multiple bits of the multiplicand stored in the corresponding memory cell;
   a set of switches configured to electrically couple the sets of voltages to corresponding wordlines of the group of memory cells storing the multiplicand for a duration of a pulse width of an input signal, wherein a multiplier is encoded as the pulse width of the input signal; and
   a bitline of the group of memory cells to receive a current corresponding to a single multiplication operation product of the multiplicand stored in the group of memory cells and the multiplier encoded as the set of voltages coupled to the corresponding wordlines of memory cells for the duration of the pulse width of the input signal.

2. The system of claim 1 wherein each memory cell is further defined as static random-access memory.

3. The system of claim 1 wherein each memory cell in the array of memory cells includes a pair of access transistors in a stacked arrangement and a storage circuit configured to store a bit value, such that the magnitude of current drawn through the pair of access transistors is determined by magnitude of voltage on the respective wordline and value of the bit stored in the storage circuit.

4. The system of claim 3 wherein a gate terminal of one access transistor in the pair of access transistors is electrically coupled to the respective wordline and a gate terminal of the other access transistor in the pair of access transistors is electrically coupled to the storage circuit.

5. The system of claim 1 wherein the driver circuit is further defined as a current mirror.

6. The system of claim 1 further comprises:
   a reference clock source that generates a clock signal; and
   a delay-locked loop configured to receive the clock signal and operates to generate the input signal with pulses having a duration that are a fraction of the clock cycle of the clock signal.

7. The system of claim 1 further comprises one or more analog-to digital converters, wherein an analog-to-digital converter is electrically coupled to a bitline and implements a dual-ramp single slope conversion method.

8. The system of claim 1 is configured to solve partial differential equations using a residual form.

9. A system for performing multiply-accumulate operations on binary numbers, comprising:
an array of memory cells arranged in columns and rows, such that memory cells in each row of the array is interconnected by a respective wordline and each column of the array is interconnected by a respective bitline;
where a group of memory cells in the array coupled to a corresponding bitline store a multiplicand such that a binary value of each bit of the multiplicand is stored in a different memory cell within the group of memory cells;
where the given group of memory cells receive a set of input signals, the set of input signals having a pulse width indicative of a multiplier and corresponding ones of the input signals have drive voltages proportional to a corresponding significance of a corresponding bit position of bits of the multiplicand stored in corresponding memory cells in the group of memory cells on the corresponding wordlines; and
where the given group of memory cells output on the corresponding bitline a product of the multiplier and the multiplicand in response to the set of input signals received by the group of memory cells.

10. The system of claim 9 wherein each memory cell is further defined as static random-access memory.

11. The system of claim 9 wherein each memory cell in the array of memory cells includes a pair of access transistors in a stacked arrangement and a storage circuit configured to store a bit value, such that the magnitude of current drawn through the pair of access transistors is determined by magnitude of voltage on the respective wordline and value of the bit stored in the storage circuit.

12. The system of claim 11 wherein a gate terminal of one access transistor in the pair of access transistors is electrically coupled to the respective wordline and a gate terminal of the other access transistor in the pair of access transistors is electrically coupled to the storage circuit.

13. The system of claim 9 further comprises one or more analog-to digital converters, wherein an analog-to-digital converter is electrically coupled to a bitline and implements a dual-ramp single slope conversion method.

14. The system of claim 9 is configured to solve partial differential equations using a residual form.

15. The system of claim 9 further comprising:
a driver circuit including a current mirror operative to generate the drive voltages that produce discharge currents proportional to the corresponding significance of the corresponding bit position of the bits of the multiplicand stored in corresponding memory cells in the group of memory cells; and
a set of input switches interposed between the driver circuit and the given group of memory cells and operative to couple the drive voltages to corresponding memory cells of the given group of memory cells for a duration of the pulse width of the set of input signals.

16. The system of claim 15 further comprises:
a reference clock source that generates a clock signal; and
a delay-locked loop configured to receive the clock signal and operates to generate the pulse width of the set of input signals having a duration that is a fraction of the clock cycle of the clock signal.

* * * * *